(12) United States Patent
Sanduleanu et al.

(10) Patent No.: US 7,768,322 B2
(45) Date of Patent: Aug. 3, 2010

(54) LOW VOLTAGE, HIGH-SPEED OUTPUT-STAGE FOR LASER OR MODULATOR DRIVING

(75) Inventors: Mihai Adrian Tiberiu Sanduleanu, Eindhoven (NL); Eduard F. Stikvoort, Eindhoven (NL)

(73) Assignee: NXP B.V., Eindhoven (NL)

( * ) Notice: Subject to any disclaimer, the term of this patent is extended or adjusted under 35 U.S.C. 154(b) by 113 days.

(21) Appl. No.: 11/577,182

(22) PCT Filed: Sep. 30, 2005

(86) PCT No.: PCT/IB2005/053229
§ 371 (c)(1),
(2), (4) Date: Apr. 8, 2009

(87) PCT Pub. No.: WO2006/040706
PCT Pub. Date: Apr. 20, 2006

(65) Prior Publication Data
US 2009/0201052 A1    Aug. 13, 2009

(30) Foreign Application Priority Data
Oct. 12, 2004    (EP) .................................. 04104989

(51) Int. Cl.
*H03K 3/00*    (2006.01)
(52) U.S. Cl. .......................... 327/108; 327/109; 326/82

(58) Field of Classification Search .................. None
See application file for complete search history.

(56) References Cited

U.S. PATENT DOCUMENTS

| | | | | |
|---|---|---|---|---|
| 5,055,721 | A * | 10/1991 | Majumdar et al. | 327/434 |
| 5,134,322 | A * | 7/1992 | Bourgeois et al. | 327/381 |
| 5,572,156 | A * | 11/1996 | Diazzi et al. | 327/109 |
| 6,538,481 | B1 * | 3/2003 | Suetsugu | 327/109 |
| 2002/0030523 | A1 | 3/2002 | Muljono et al. | |
| 2002/0089351 | A1 | 7/2002 | Stockstad | |

* cited by examiner

*Primary Examiner*—An T Luu

(57) ABSTRACT

The present invention provides a driving circuit (100) in particular for driving a laser diode (700) or a modulator, at data speed in the order of Gb/s. The driving circuit (10) has a low-voltage, high-speed output stage capable of driving efficiently a laser diode (700) or a modulator The driver circuit (10) comprises a chain of circuits, said chain comprising a slew-rate control circuit, at least one translinear amplifier (200, 201, 202), a push/pull stage (300), and an output stage (400) for driving the load current. Due to its versatility, the driver can be used in other applications e.g. line drivers, cable drivers, high-speed serial interfaces for back-plane interconnect, etc. The driver can work at low supply voltages, e.g. 3.3V nominal down to 2.7V, with high power efficiency. One major clue is to use entirely the large signal current produced by the output stage, e.g. in the driven laser diode, without wasting current in supply lines.

24 Claims, 5 Drawing Sheets

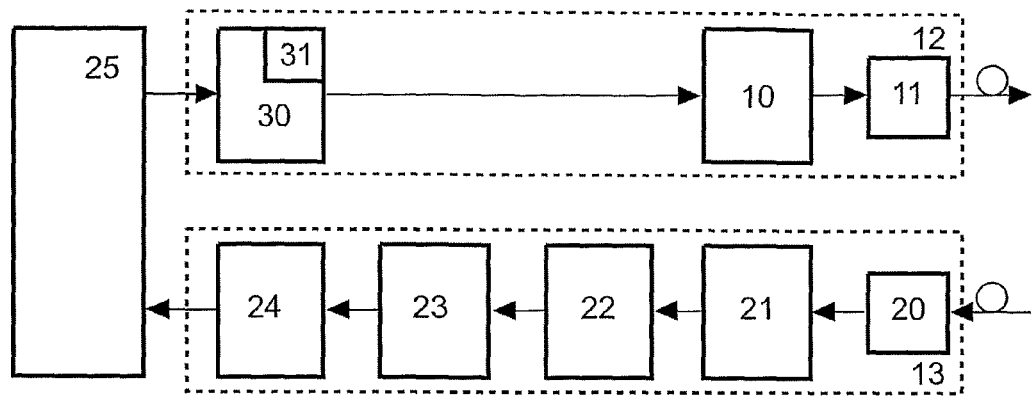
Fig.1
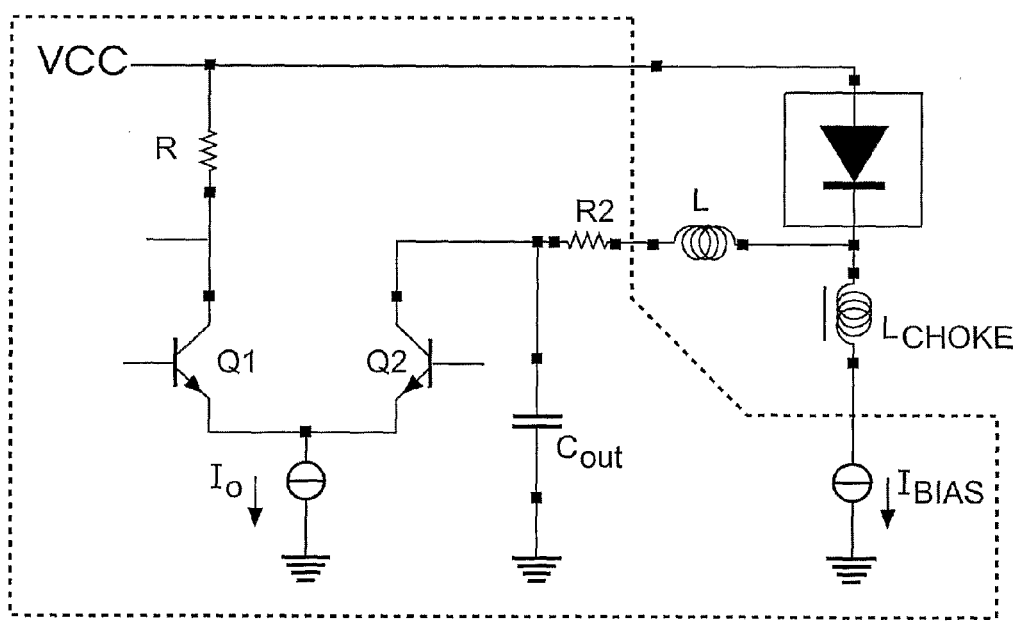
PRIOR ART  Fig.2

LOW VOLTAGE, HIGH-SPEED OUTPUT-STAGE FOR LASER OR MODULATOR DRIVING

The present invention relates to a driver circuit for driving a load current at an output node in accordance to a driving pulse signal according to claim 1, and a method according to claim 14. In particular, a driver circuit for driving a laser diode or a modulator, e.g. Mach-Zender modulator. Further, the driver circuit can be used in applications as line drivers, cable drivers, and high-speed serial interfaces for back-plane interconnect.

Optoelectronic transceiver modules provide an interface between an electrical system and an optical transfer medium such as an optical fibre. Correspondingly, most optoelectronic transceiver modules contain electrical and optical conversion circuitry for transferring data to and from the electrical system and the optical transfer medium. Normally, transceiver modules use laser diodes, which produce coherent light for performing high-speed data transfers between the electrical system and the optical transfer medium.

For instance, FIG. 1 shows the place of a laser driver 10 in a fibre optic transceiver. The laser driver precedes the laser diode 11 or the Mach-Zender modulator. In short, there is a transmitter 12, a receiver 13 and a channel (not shown) that conveys energy from the transmitter 12 or to the receiver 13, respectively. The function of the optical receiver 13 is the detection of an incoming, e.g. non-return to zero (NRZ), optical signal and the regeneration of the transmitted data. The combination of a photo-detector 20 and a transimpedance amplifier 21 is known as the front end. The front end is followed by a limiting amplifier 22, a data/clock recovery 23 and a demultiplexer (DEMUX) 24. The low data rate parallel outputs of the DEMUX 24 are applied to a data processor 25. At the side of the transmitter 12, a multiplexer (MUX) 30 performs a parallel to serial conversion where a phase locked loop unit 31 generates a low-jitter clock for retiming of the NRZ data stream to be transmitted via the channel. The laser driver 10 must provide sufficient voltage swing and adequate current levels for the laser diode 11.

Driving a laser diode or a Mach-Zender modulator can be a daunting task when data is to be transmitted at data speeds in the order of Gb/s. In particular, currents in the order of tens of mA's have to be brought to the load, i.e. the laser diode, for instance, via an integrated circuit to printed circuit board (IC-PCB) interface. A major problem resides in the large parasitic inductances of the interface impairing the sharp rise-fall time requirements at high frequencies. Furthermore, it is desired to have such driver circuits working reliably at lower supply voltages as well as with high efficiency. Known standard driver stages fail working properly.

For the purpose of data transmission via a fibre optic medium, a laser diode is used as a directly biased diode. In principle, the laser driver is a controlling device for the bias current and the modulation of the laser diode. FIG. 2 shows a state of the art output stage. It should be noted that in the following only the output stage is focused without considering the pre-driver. In the output stage of FIG. 2, the modulation current comes from the differential pair Q1, Q2 and the bias current or a part of Ibias from a separate current source. The series resistor R2 acts as a damping resistor for the series parasitic inductor L combined with the large parasitic capacitance Cout of the output stage. This approach suffers several drawbacks.

First, half of the modulation current is wasted in the supply caused by the differential circuit. Considering the fact that modulation currents of about 80 mA are not uncommon, this is a massive waste of power. Secondly, the single ended current injected in the supply needs an extra output pin. Thirdly, the direct current coupling with the laser diode limits the supply voltage to about 5V. With reference to FIG. 2, a supply voltage of 3.3V is assumed. In worst case (3.3V-10%) the voltage supply may drop to 3V. For instance, Fabry-Perot type laser diodes need a biasing voltage of e.g. 1.8 V. Further, modulation currents of 60 . . . 80 mA are common for aged lasers. Furthermore, requiring rise-fall times of 25 ps at 10 Gb/s, a damping resistor R2 in the order of 10 to 20 Ohms and total series parasitic inductor L in the order of about 1.5 nH, it is impossible to keep the output stage out of saturation. This can be derived of the following equation (1) calculating the lowest voltage sustained by the stage.

$$V_{LOW} = VCC - Vbias - I_0 * R_2 - L * \frac{di}{dt}. \quad (1)$$

As basic approach, a laser driver may have within its output stage a single output transistor for driving the modulating current in the laser diode. The principle is depicted in FIG. 3 where the driver circuit (depicted as a dotted triangle) is controlling an output transistor Tout. In order to quantify, in first order, the transfer of the circuit composed of the laser driver and the laser diode, a simple small signal model as in FIG. 3 is used. Therefore, the laser diode is replaced with an incremental resistor R, and L represents the parasitic series inductances of the bond-wire and laser package. Rout and Cout represent the output impedance of the driver circuit seen by the laser diode. The transfer function exhibits a second order behaviour as shown in equation (2) suggesting the possibility of ringing at the output.

$$\frac{i_{Laser}}{i_{driver}} = \frac{1}{s^2 + s\left(\frac{1}{Rout\,Cout} + \frac{R}{L}\right) + \left(\frac{R}{Rout} + 1\right)\frac{1}{LCout}} \quad (2)$$

The natural frequency $\omega 0$ and the damping ratio $\delta$ of the second order transfer function are given by equations (3).

$$\omega 0 = \sqrt{\left(\frac{R}{Rout} + 1\right)} \sqrt{\frac{1}{LCout}}; \quad (3)$$

$$\delta = \frac{1}{2} \frac{\left(\frac{L}{Rout\,Cout} + R\right)}{\sqrt{\frac{R}{Rout} + 1}} \sqrt{\frac{Cout}{L}}$$

As can be derived from equation (3), by adjusting correctly the output resistance Rout of the output stage the peaking in the transfer can be damped, i.e. $\delta$ must be larger than 0.707.

$$Rout \leq L\sqrt{\frac{1}{2LC - R^2C^2}} \quad (4)$$

Accordingly, by filling in realistic values for the components, the output resistance Rout of the output stage has to be smaller than 54 Ohm. However, a resistor to ground or to the positive supply for fixing the output impedance as required is not a good measure since it would increase power dissipation and also decrease current efficiency. Further, the output transistor brings a large capacitance that has to be charged and discharged during each transition of the driving pulse signal, which is also counteracting the rise/fall time requirements.

It is therefore an objective of the present invention to provide a driver circuit with higher power efficiency, in particular to have an output stage that uses the entire large signal current controlled by the output stage in the driven load, e.g. a laser diode, without wasting current in the driver circuit. It is a further objective of the invention to have an output stage that has an output impedance with a predetermined value for preventing waveform distortion at the output, e.g. caused by reflections. A further objective is to have a dc component of the driving signal controlled such that transistor means in the output stage are biased by said dc component. Another objective is the conditioning of the signal so that the rise and fall time of the modulated current in the laser diode matches to the requirements of the laser.

All or some of the objectives are solved by a driver circuit for driving a load current at an output node in accordance to a driving pulse signal according to claim 1, and a method according to claim 14.

According to a first aspect of the invention, said driver circuit comprises slew-rate control means for controlling the slew-rate of said driving pulse signal by adding current pulses to rising and falling edges of said driving pulse signal, at least one amplifying means coupled to said slew-rate control means, and output means arranged for receiving said driving pulse signal from said at least one amplifying means. Said output means comprising output transistor means arranged for modulating said load current and impedance means for determining an output impedance of said output means. Said impedance means are connected to said output node and comprising control means for substantially suppressing dc current from said output node into said impedance means.

In a preferred embodiment said impedance means comprise an impedance element connected between said output node and a floating node. Said control means comprise feedback means for controlling a potential of said floating node to match a potential of said output node. By the feedback means direct current from said output node through said impedance element is advantageously forced to be zero. Further, there are also feedforward means for adjusting said potential of said floating node corresponding to said potential of said output node onto a transition of said driving pulse signal. By said feedforward means said potential of said floating node is changed at the same time and in the same amount as said potential of the output node. Thus, advantageously the current through the impendence element caused by said driving pulse signal is substantially forced to be zero. Hence, by said impedance means the output impedance is advantageously fixed to a desired impedance value without waste of power within said impedance element.

In a further development, said control means may comprise a replica transistor means being a small current replica to said output transistor means. Advantageously, said replica transistor means have a predetermined current ratio to said output transistor means whereby current within said control means is scaled down and power dissipation by said control means is reduced to a minimum. Said impedance element may be a fixed resistor or a tuneable resistor. A tuneable resistor brings as further advantage that said output impedance of said driver circuit can be adjusted on site to a needed value with regard to a certain driven load.

According to a second aspect of the invention, said driver circuit may further comprise a push/pull driver for conversion of a balanced driving pulse signal into an unbalanced driving pulse signal. Said push/pull driver is preferably coupled between said at least one amplifying means and said output means, in particular, when said amplifying means are differential amplifying means. Advantageously, by said push/pull driver the entire driving pulse signal is used for controlling the output transistor means, in particular no current gets wasted. Furthermore, the entire current at the output of the push/pull driver is charging and discharging the parasitic capacitance of the large signal output transistor means.

According to a third aspect of the invention, said at least one amplifying means may comprise active load means and a dc feedback loop for controlling a predetermined dc component of said balanced driving pulse signal at an output of said amplifying means by adjusting a bias of said active load means. Said dc feedback loop may comprise a pair of feedback transistor means being both connected to a constant current source which supplies bias current to said active load means and being arranged to draw off current from said current source corresponding to said predetermined dc component of said driving pulse signal.

According to a fourth aspect of the invention, said slew-rate control means may comprise a balanced input and a balanced output for said driving pulse signal each having respective first and second input and output nodes, respectively. Said slew-rate control means have further current injection means for injecting a predetermined positive amount of current to said balanced driving signal at an output node during a rising edge of said driving pulse signal and for injecting a predetermined negative amount of current to said driving pulse signal at a output node during a falling edge of said driving pulse signal. Therefore, in one embodiment said current injection means comprise differentiating means arranged such that current pulses are created by transitions of the driving pulse signal input at said balanced input of said slew-rate control means. Respective first and second current pulse amplifying means are coupled to respective current sources which provide respective constant currents. Said first and second current pulse amplifying means are arranged such that predetermined current pulses are injected at said output nodes during transitions of said driving pulse signal. In a preferred embodiment of the invention, said respective constant currents are adjustable. Hence, the amount of injected current can be adjusted with respect to the behaviour of the driven load, e.g. a laser diode.

Preferably, said driver circuit is used for driving a laser diode or a modulator, e.g. Mach-Zender modulator. In this cases said output stage is connected to a laser diode or modulator circuit. Due to its versatility, the driver circuit can be used in other applications e.g. line drivers, cable drivers, high-speed serial interfaces for back-plane interconnect, etc.

Said method according the present invention for high-speed driving a load current corresponding to a pulsed driving signal, said load current being modulated by switching of a switching element, said method comprises conditioning a pulsed driving signal by adding current pulses to falling and rising edges of said pulsed driving signal, amplifying said conditioned pulsed driving signal, and switching a switching element by applying said conditioned pulsed driving signal. Further, said added current pulses of said conditioning step may be adjusted such that a parasitic capacity of said switching element is compensated.

It goes without saying that the driver circuit according to the invention can realize all feature according to any of the mentioned aspects. It is also possible said one or a selection of the mentioned first, second, third, and fourth aspects may be used in an embodiment of the invention. Moreover, it is clear to the one skilled in the art, that single aspects of the invention may also be used in other circuitry for solving similar problems. Hence, it is noted that there is the option that a divisional application will be filed claiming one or several aspects of the present invention.

The present invention will now be described on the basis of a preferred embodiment with reference to the accompanying drawings, in which:

FIG. 1 shows a block diagram of a fibre optic transceiver with a laser driver circuit;

FIG. 2 shows a state of the art output stage;

Figure 3:
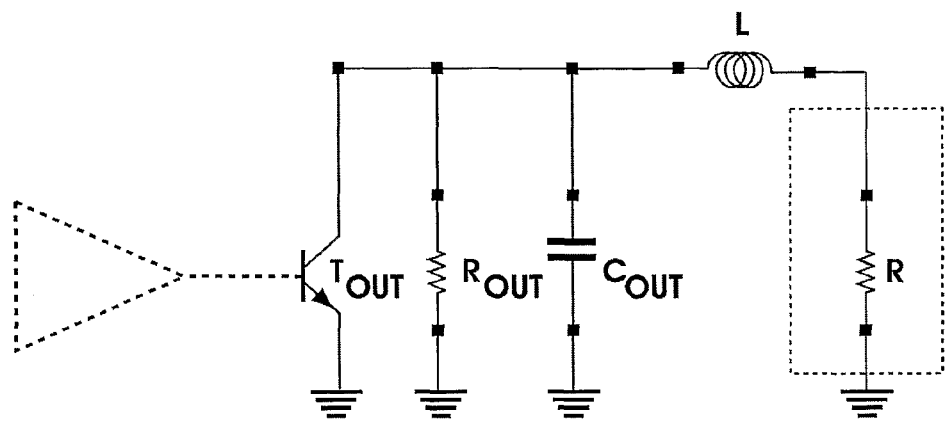
FIG. 3 shows an equivalent schematic circuit diagram of a transistor driving a laser diode.
Figure 4:
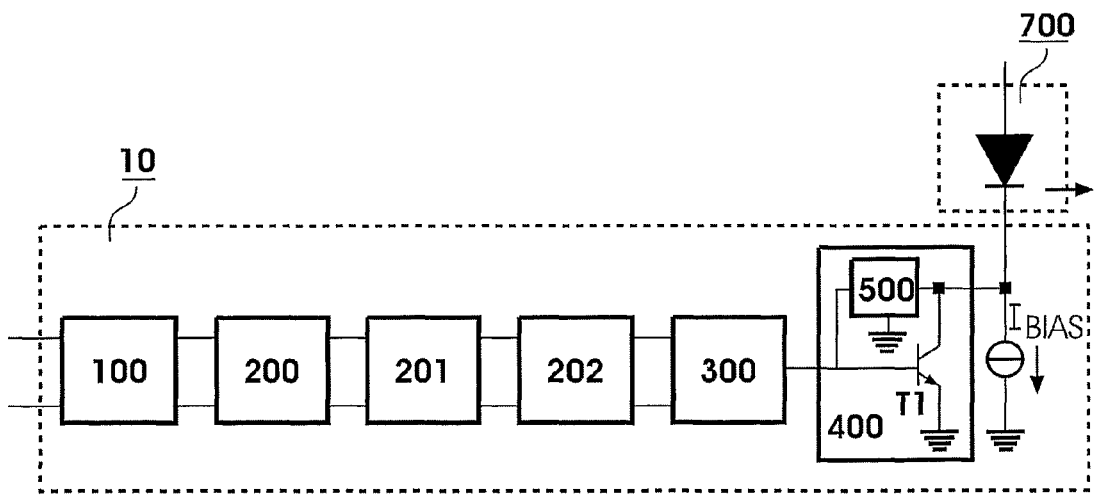
FIG. 4 shows a block diagram of the driver circuit according to the preferred embodiment.

FIG. 4 shows, as a general overview, the block diagram of the driver circuit 10 according to a preferred embodiment. It consists of slew-rate control means or slew-rate control stage 100, three amplifying means or gain stages 200, 201, 202 which are current-scaled, a push/pull driver 300 and an output means or single-ended output stage 400 with an output transistor T1. The slew-rate control stage 100 allows the control of the rise and fall time of the driving pulse signal and thus, of the driven load current, e.g. by a variable external voltage. In other words, the slew-rate control stage 100 speeds-up (or slows down) the pulse trailing edge of the driving pulse signal such that the corresponding edges of the signal in the laser diode are enhanced (or smoothed) according to the rise/fall time requirements. The gain stages 200, 201, 202 are differential translinear cells with active loads limiting the amplitude of the driving pulse signal to maximum difference from peak to peak 100 mV (diff-pp). The gain stages 200, 201, 202 act as soft limiters for the driving pulse signal and the gain stage 200, 201, 202 are up-scaled in current towards the load. The last stage 202 is coupled to a differential to single-ended conversion means for driving the large output transistor T1. Said conversion is done by a push/pull driver 300. In other words, the driving pulse signal is a balanced signal up to the last gain stage 202, where it is converted to an unbalanced driving pulse signal by the push/pull driver 300. It goes without saying that the pus/pull stage 300 may also be incorporated in the last gain stage 202.

As mentioned above, one aspect of the invention is to have the entire current of the driver circuit 10 at the output used for driving the load, e.g. a laser diode 700. Thus, the output stage 400 is composed of a single large signal semiconductor element, i.e. the transistor T1, which is controlled by the driving pulse signal provided by the push/pull driver 300. In particular, the driving pulse signal coming from the push/pull stage 300 comprises a dc component and an alternating pulse component. The dc component is adjusted such that the transistor T1 is biased correctly. The alternating pulse component carries the information which is to be modulated on the driven load current.

Due to temperature or space requirements, the laser diode 700 may be separated from the driver circuit and therefore, may be coupled via a transmission line, e.g. a TEM waveguide, to the output stage 400. For absorbing reflections from the load, as may occur when the laser diode 700 is connected by means of a transmission line, the output impedance of the output stage 400 should be fixed to a certain value which depends of the particular load coupled to the driver output stage 400. However, as mentioned above, additional power loss by simply connecting a resistor between the output node and the ground of the circuit is not a preferred solution since the potential of the output node would drive current through such a resistor increasing power dissipation.

Figure 5:
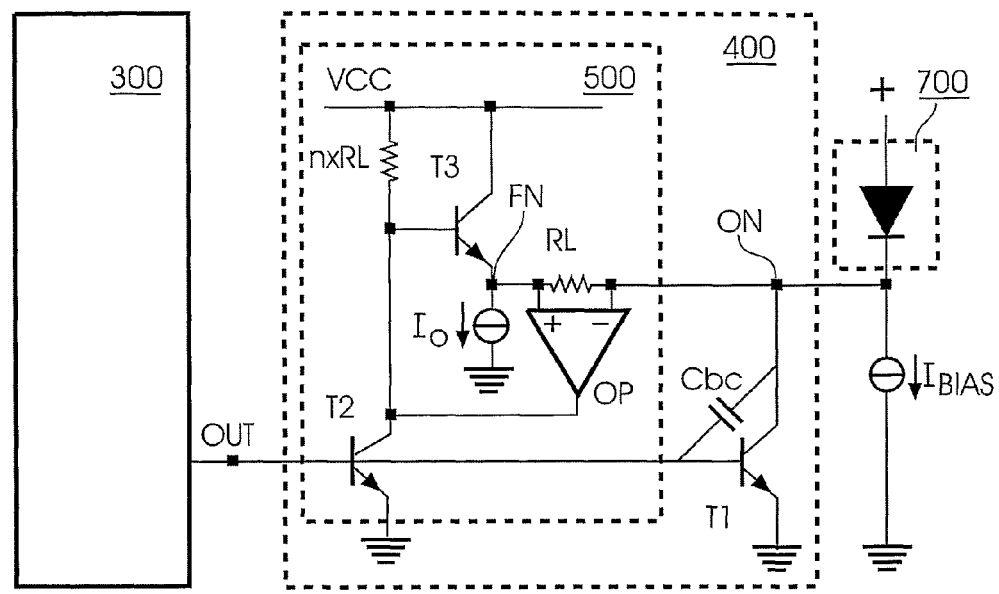
FIG. 5 shows a schematic circuit diagram of the output stage of a driver circuit of the invention according to the preferred embodiment.

The solution of this problem is presented in FIG. 5. In principle, there are impedance means 500 connected to the output node ON of the driver circuit 10. In the preferred embodiment, said impedance means are also connected to the output OUT of said push/pull driver 300, i.e. the driving pulse signal is also input to the impedance means 500. In detail, according to the preferred embodiment, the impedance means 500 comprise a replica transistor T2 that is a small current replica of the output transistor T1. It should be noted that small current replica means that replica transistor T2 is scaled in current with a scale of 1-to-n in comparison to output transistor T1, i.e. the emitter current of output transistor T1 is n times larger than of replica transistor T2. The replica transistor T2 is also controlled at its base by the driving pulse signal coming from the push/pull stage 300 and is connected with its emitter to ground and with its collector via a resistor nxRL to the supply voltage VCC of the driver circuit 10. To the collector of T1 is coupled an emitter follower which generally is composed of a transistor T3. Transistor T3 is connected with its collector to the supply voltage VCC and with its emitter via a constant current source I0 to ground. Hence, the potential of the emitter of T3 is a floating potential. The emitter of T3 is referenced as floating node FN. Resistor RL is connected between the output node ON and the floating node FN. This results in that the output impedance is fixed below a predetermined value, i.e. the resistance value of resistor RL, e.g. which is below 54 Ohms as needed in the example above. In other words, the resistor RL is defining the output impedance of the driver circuit 10, which is "seen" from the load.

For suppression of any current through said resistor RL there are provided control means consisting of feedback and feedforward means, respectively. The feedback means are a direct current (dc) feedback loop around transistor T3 forcing a direct current on the resistor RL to be zero. In particular, there is an operational amplifier OP to which the resistor RL is coupled between an inverting (−) and a not inverting (+) input of the operational amplifier OP. The output of the operational amplifier OP is connected to the base of the transistor T3. Thus, if there is a dc current through resistor RL then a respective output of the operational amplifier OP will increase or decrease, respectively, the potential at the base of transistor T3. Consequently, the emitter follower composed of T3 will respectively increase or decrease the potential of the floating node FN. Hence, the feedback loop controls the potential of the floating node FN such that it matches the potential of the output node ON. This results in that any dc current will be suppressed through the resistor RL. In the preferred embodiment there are further feed-forward means which are a feedforward loop around transistors T2 and T3. By the feedforward loop an alternating current on RL caused by transitions of the potential of the output node ON according to the driving pulse signal is suppressed beforehand. In particular, if the driving pulse signal has a transition from its low level to its high level both the potential of the floating node FN via the emitter follower of T3 and the potential of the output mode ON controlled by the transistor T1, is changed together in the same time. Hence, alternating currents, which would be caused by the transmissions of the driving pulse signal, are suppressed by the feedforward control means. As a further advantage, the emitter follower T3 also absorbs any reflections from the load, e.g. the laser diode 700. The bias current Ibias sets the onset direct current (dc) point of the laser diode 700.

Figure 6:
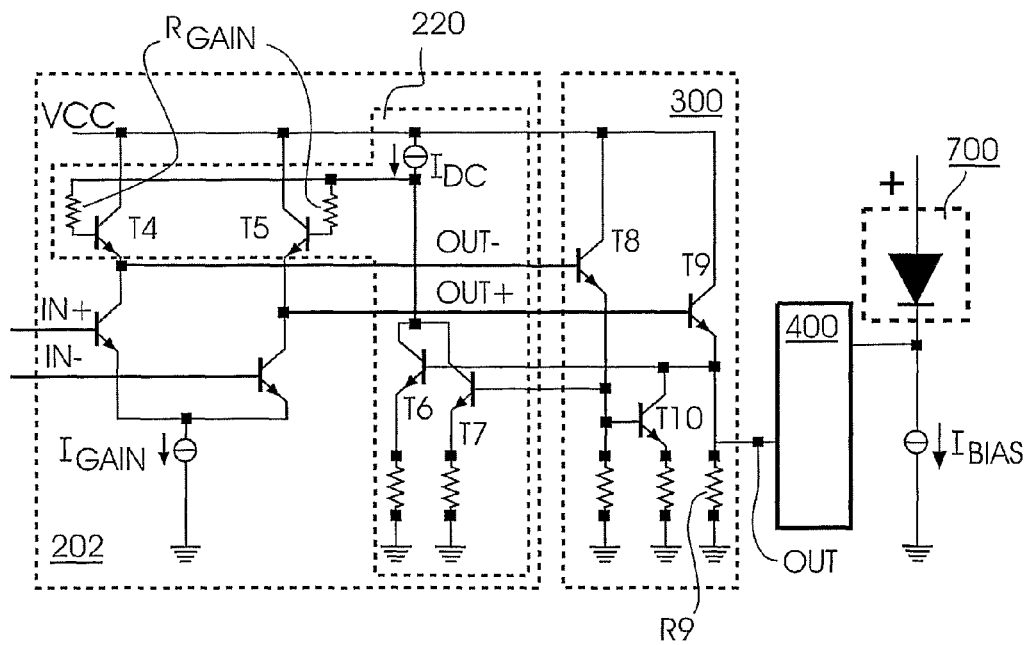
FIG. 6 shows a schematic circuit diagram of amplifying stage and a push/pull driver of the invention according to the preferred embodiment.

FIG. 6 shows the last gain stage 202 together with the push/pull driver 300. The bias current Ibias sets the onset dc point of the laser 700. The gain stage 202 is a differential translinear cell with active loads, which are composed of transistors T4 and T5. A peculiar characteristic of the differential translinear cell is the independence between the rise/fall time and the amplitude of the passing signal, i.e. in this case of the driving pulse signal. By keeping small swings, i.e. smaller than 100 mV diff-pp, these differential translinear cells can work at low voltages with its gain controlled from the value of the resistors Rgain and the tail current provided by constant current source Igain.

Another problem, which is solved by the gain stage 202, is the ground reference of the output stage 400. In particular, as mentioned above, for modulation of the load current the output transistor T1 is biased by a predetermined dc voltage, i.e. a predetermined base to emitter voltage. In the preferred embodiment of the invention, the transistor T1 is controlled at its base by the driving pulse signal which has a dc component for biasing the transistor T1. It is a critical aspect to have the correct dc component for biasing the base-emitter voltage of transistor T1. Therefore, the last gain stage 202 of the driver circuit 10 comprises dc component control means 220. In the preferred embodiment of the invention, the dc component control means 220 are a control loop for controlling the dc component of the driving pulse signal. In detail, the transistors T6 and T7 are measuring the dc component of the driving pulse signal at the output of the emitter-followers composed of transistors T8 and T9, respectively. For instance, if the dc component of the driving pulse signal is to large, the dc component causes both transistor T6 and T7 to draw too much current from the bias current source Idc that supplies the current to the base resistors Rgain. This causes a decrease in the base voltage of the active loads composed of transistors T4 and T5 and consequently to a decrement of the dc voltage in the emitters of T8 and T9. Thus, the output driving pulse signal of the gain stage 202 has basically a controlled dc component for biasing the output transistor T1.

The push/pull stage 300, also shown in FIG. 6, comprises transistors T9 and T10 which are driving the output transistor T1 in a push/pull configuration. In particular, transistors T9 and T10 provide the current charging and discharging, respectively, the large parasitic capacitance Cbc of the output transistor T1. Therefore, the balanced driving pulse signal from the last gain stage 202 is converted by means of the push/pull stage 300 in an unbalanced driving pulse signal at the output OUT of the push/pull stage 300. This results in that the entire current corresponding to the driving pulse signal is used for controlling the output transistor T1 which is modulating the load current through the laser diode 700.

In detail, first it is assumed that the driving pulse signal has a low level at the negative output OUT− of the last gain stage 202. Then transistor T8 is reduced in conductance leading to a decreased base to emitter voltage at transistor T10 which is therefore also reduced in conductance and does not draw current from the output stage 400. Further, if the driving pulse signal has a low level at the negative output OUT− then there is a corresponding high level at the positive output OUT+ of the last gain stage 202, which causes transistor T9 to be increased in conductance. Hence, current from transistor T9 is delivered to the output transistor T1 in the output stage 400.

In turn, if the driving pulse signal has a high level then transistor T8 is increased in conductance leading also an increase base to emitter voltage at transistor T10 which is also increased in conductance. Further, if the driving pulse signal has a high level at the negative output OUT− then there is a corresponding low level at the output OUT+, which causes transistor T9 to be decreased in conductance. Hence, current is drawn from the output transistor T1 in the output stage 400. It is worth to be noted that due to the signal conditioning in the slew-rate control stage 100 the transitions of the driving pulse signal are powered up by the added current pulses also leading to a quicker charge and discharge of the capacitance Cbc of transistor T1. In the preferred embodiment, there is a resistor R9 in the emitter path of transistor T9 which is arranged such that it provides output transistor T1 with the applicable base to emitter bias voltage which corresponds to the dc component of the driving pulse signal. It is to be noted that instead of R9 also a current source having a predetermined current may be used.

The gain stages 200, 201, 202 are generally identical with the last gain stage 202, with the exception of the tail constant currents Igain and the respective dimensions of the transistors due to the scale in current towards the output stage 300. Further, it should be noted that only the output of the stage 300 needs to be the dc controlled.

Figure 7:
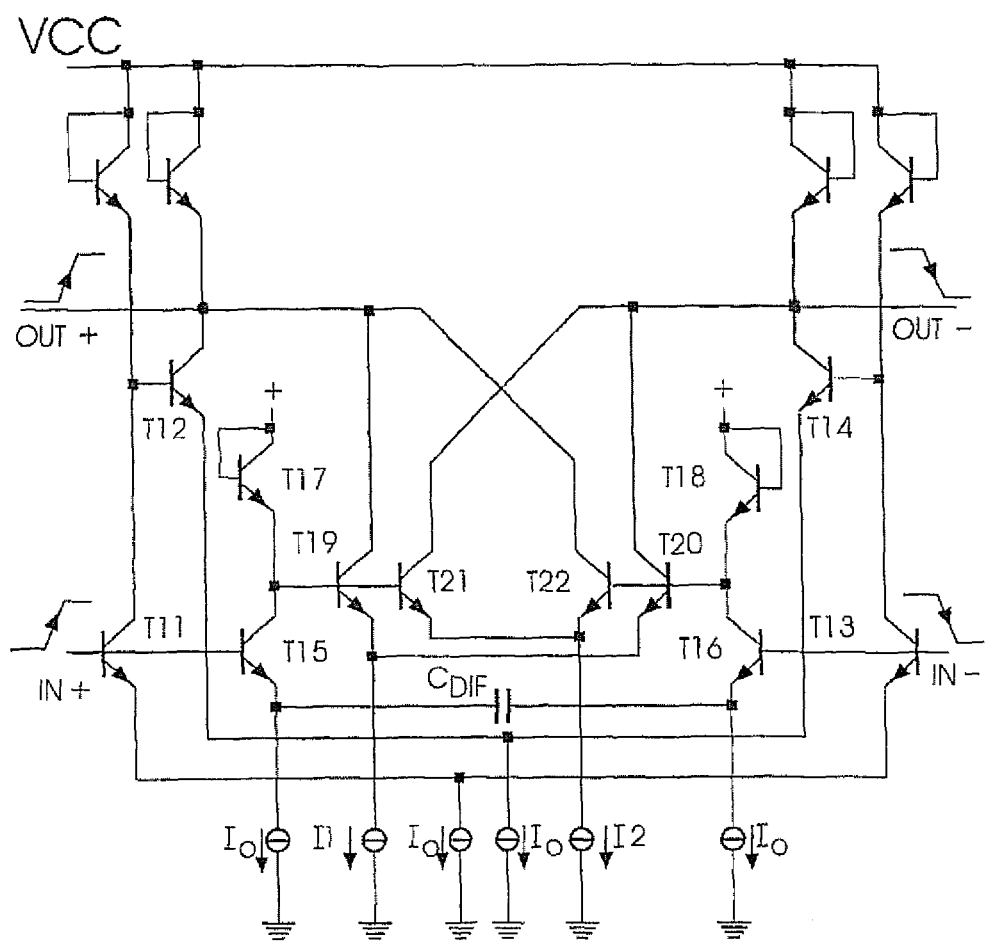
FIG. 7 shows a schematic circuit diagram of a slew-rate control stage of the invention according to the preferred embodiment.

Different lasers have different pulse responses and usually the rising edge is faster than the trailing edge. Further, laser diodes do not have exactly identical output characteristics, caused by manufacturing spread. Furthermore, there can be large parasitic inductances of e.g. packages and bonding wires. Moreover, there is the large parasitic capacitance Cbc in the output transistor T1 which has to charged or discharged, respectively, at each transition of the driving pulse signal. This impairs the desired sharp rise-fall time requirements. To counteract this, the driver circuit 10 of the preferred embodiment provides an externally programmable slew-rate control. This signal conditioning part, i.e. the slew-rate control means or slew-rate control stage 100, is presented in FIG. 7. The input differential signal, i.e. the driving pulse signal is amplified at the output by the feed-forward gain path consisting of transistors T11, T12, T13, T14. Via the transistors T15, T16 a copy of the input voltage of the driving pulse signal is created on capacitor Cdif, which acts as differentiation means and causes current spikes during each transition of the input driving pulse signal. These current spikes are applied to the transistors T17 and T18, respectively, which control respective current amplifiers composed of transistors T19 and T20, T21 and T22. This results in that the current amplifiers composed of transistors T19 and T20, T21 and T22 cross-inject at the output of the slew-rate control stage 100 (i.e. OUT− and OUT+, respectively) current pulses when the output voltage is slewing. The amount of the cross-injected charge is programmable from the current sources I1 and I2. The effects are faster or slower edges of the pulses of the driving pulse signal at the output of the slew-rate stage 100, which is advantageously adjustable by the constant currents sources I1 and I2. For instance, if I1=Ix−dI and I2=Ix+dI then an added or detracted current pulse is dI.

Figure 8:
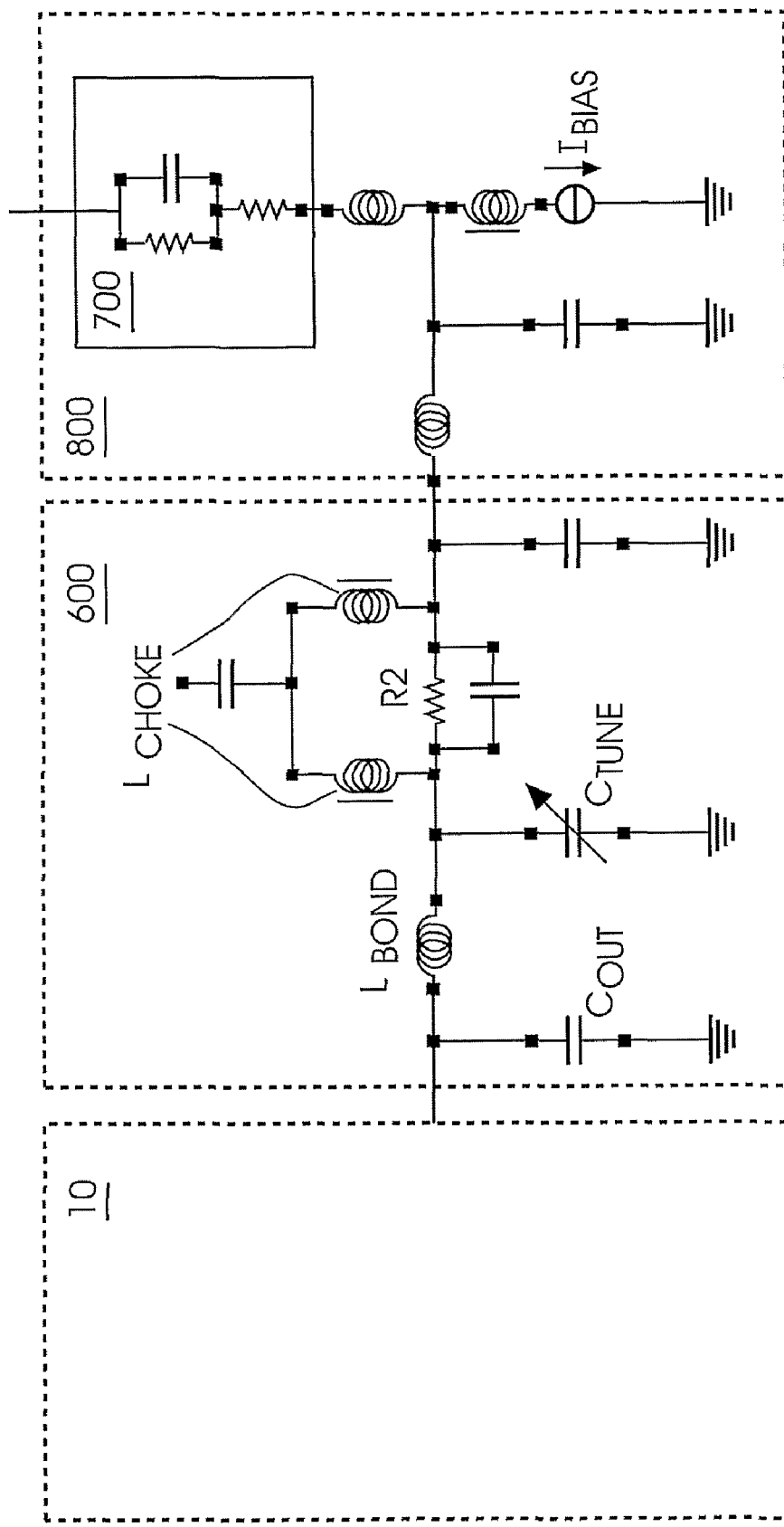
FIG. 8 shows a schematic circuit diagram of a laser-driver interface according to the preferred embodiment.

For driving the laser diode 700, a respective driver-laser interface 600 is shown in FIG. 8. The laser equivalent circuit is shown in the section 800 containing also the laser diode 700. In particular, the bonding wire inductance Lbond can be tuned away by the capacitor Ctune, the resistor R1 damps the response of the driver-laser interface 600. Two choke inductors Lchoke are provided to ensure a zero direct current voltage drop over R1. In the worst-case laser scenario, the driver circuit 10 of the present invention can drive a Fabry-Perot laser with a biasing voltage of 1.8V from a bias supply voltage of 3.3V±10%. The internal provided termination resistor RL can be chosen to match the laser characteristic and even made tuneable. The resistor provides a matching termination on the IC side for minimum reflections in the collector of the driving transistor T1.

In summary, the present invention provides a driving circuit, in particular for driving a laser diode or an modulator, at data speed in the order of Gb/s. High-speed driving signals, where currents in the order of tens of mA's have to be brought to the load, face the problem that the large parasitic inductances of the interface lines impair the sharp rise-fall time requirements. Further, laser diode do not have exactly identical output characteristics due to manufacturing spread and furthermore, in operation the output characteristics are also strongly influenced by the absolute temperature of the laser diode. Therefore, a suitable form of control was needed. The present invention provides a low-voltage, high-speed output stage capable of driving efficiently a laser diode or a modulator. The driver circuit 10 comprises a chain of circuits, said chain comprising a slew-rate control circuit, at least one translinear amplifier, a push/pull stage, and an output stage for driving the load current. Due to its versatility, the driver can be used in other applications e.g. line drivers, cable drivers, high-speed serial interfaces for back-plane interconnect, etc. The driver can work at low supply voltages (3.3V nominal) down to 2.7V with high power efficiency. One major clue is to use entirely the large signal current produced by the output stage, e.g. in the driven laser diode, without wasting current in supply lines.

Finally but yet importantly, it is noted that the term "comprising" when used in the specification including the claims is intended to specify the presence of stated features, means, steps or components, but does not exclude the presence or addition of one or more other features, means, steps, components or groups thereof. Furthermore, the word "a" or "an" preceding an element in a claim does not exclude the presence of a plurality of such elements. Moreover, any reference sign do not limit the scope of the claims.

The invention claimed is:

1. A driver circuit for driving a load current at an output node according to a balanced driving pulse signal, said driver circuit comprising:
    a slew-rate controller that adds current pulses for rising and falling edges of said balanced driving pulse signal;
    at least one amplifier coupled to said slew-rate controller; and
    an output device that receives said balanced driving pulse signal from said at least one amplifier, said output device further comprising:
    an output transistor that modulates said load current, and
    an impedance device that determines an output impedance of said output device, said impedance device being connected to said output node and further comprising:
        a current controller that substantially suppresses a current from said output node into said impedance device.

2. The driver circuit of claim 1, wherein said impedance device further comprises:
    an impedance element coupled between said output node and a floating node, wherein said current controller further comprises:
        a feedback device that controls a potential of said floating node to match a potential of said output node, and
        a feedforward device that adjusts said potential of said floating node corresponding to said potential of said output node onto a transition of said balanced driving pulse signal.

3. The driver circuit of claim 2, wherein said impedance device further comprises:
    a replica transistor that sends a small current replica to said output transistor and has a predetermined current ratio to said output transistor.

4. The driver circuit of claim 2, wherein said impedance element comprises at least one of a fixed resistor and a tunable resistor.

5. The driver circuit of claim 1, further comprising:
    a push/pull driver that converts the balanced driving pulse signal into an unbalanced driving pulse signal, said push/pull driver being coupled between said at least one amplifier and said output device.

6. The driver circuit of claim 1, wherein said at least one amplifier further comprises:
    an active load; and
    a dc feedback loop that controls a predetermined dc component of said balanced driving pulse signal at an output of said at least one amplifier by adjusting a bias of said active load.

7. The driver circuit of claim 6, wherein said dc feedback loop further comprises:
    a pair of feedback transistors connected to a constant current source which supplies a bias current to said active load for drawing off a current from said constant current source corresponding to said predetermined dc component of said balanced driving pulse signal.

8. The driver circuit of claim 1, further comprising:
    at least two amplifiers connected in cascade and being up-scaled in current towards the output device.

9. The driver circuit of claim 1, wherein said slew-rate controller further comprises:
    a balanced input and a balanced output for said balanced driving pulse signal each having respective first and second input nodes and output nodes, respectively, and having a current injector that injects a predetermined positive amount of current to said balanced driving pulse signal at an output node during a rising edge of said balanced driving pulse signal and injects a predetermined negative amount of current to said balanced driving pulse signal at a output node during a falling edge of said balanced driving pulse signal.

10. The driver circuit of claim 9, wherein said current injector further comprises:
    a differentiator that creates current pulses, and
    respective first and second current pulse amplifiers coupled to respective current sources that provide respective substantially constant currents, said first and second current pulse amplifiers injecting at said output node predetermined current pulses during transitions of said balanced driving pulse signal.

11. The driver circuit of claim 10, wherein said respective substantially constant currents are adjustable.

12. The driver circuit of claim 1, wherein said output device is connected to at least one of a laser diode and a modulator circuit.

13. The driver circuit of claim 1, wherein the driver circuit is implemented in at least one of a laser driver, a line driver, a cable driver, and a high-speed serial interface for a back-plane interconnect.

14. A method for high-speed driving a load current to a switching element, comprising:
   generating a pulsed driving signal having rising and falling edges;
   conditioning the pulsed driving signal by adding current pulses to said falling and rising edges of said pulsed driving signal to generate a conditioned pulsed driving signal;
   amplifying said conditioned pulsed driving signal; and
   switching the switching element by applying said amplified conditioned pulsed signal.

15. The method of claim 14, further comprising:
   adjusting the current pulses obtained in the conditioning step for compensating a parasitic capacity of said switching element.

16. The driver circuit of claim 2, wherein the feedback device further comprises an operational amplifier.

17. The driver circuit of claim 2, wherein the feedback device controls a potential of the floating node to match a potential of the output node.

18. The driver circuit of claim 2, wherein the feedforward device suppresses alternating currents in the balanced driving pulse signal.

19. The driver circuit of claim 5, wherein the push/pull driver further comprises an emitter path resistor that provides a bias voltage corresponding to a dc component of the balanced driving pulse signal.

20. The driver circuit of claim 1, wherein the slew-rate controller is externally programmable.

21. The driver circuit of claim 10, wherein the differentiator comprises a capacitor that causes current spikes during each transition of the balanced driving pulse signal.

22. The driver circuit according to claim 4, wherein said impedance element is a fixed resistor.

23. The driver circuit of claim 4, wherein said impedance element is a tunable resistor.

24. The method of claim 14, wherein the rising edges and the falling edges have respective slew rates, and further comprising
   generating a current pulse during each rising edge and during each falling edge, each current pulse having a respective magnitudes based, at least in part, on the respective slew rate.

* * * * *

UNITED STATES PATENT AND TRADEMARK OFFICE
CERTIFICATE OF CORRECTION

| | | |
|---|---|---|
| PATENT NO. | : 7,768,322 B2 | Page 1 of 1 |
| APPLICATION NO. | : 11/577182 | |
| DATED | : August 3, 2010 | |
| INVENTOR(S) | : Mihai Adrian Tiberiu Sanduleanu et al. | |

It is certified that error appears in the above-identified patent and that said Letters Patent is hereby corrected as shown below:

In column 1, line 9, delete "Mach-Zender" and insert --Mach-Zehnder--.

In column 1, line 24, delete "Mach-Zender" and insert --Mach-Zehnder--.

In column 1, line 41, delete "Mach-Zender" and insert --Mach-Zehnder--.

In column 3, line 49, delete "impendence" and insert --impedance--.

In column 4, line 46, delete "Mach-Zender" and insert --Mach-Zehnder--.

In column 5, line 51, delete "pus/pull" and insert --push/pull--.

Signed and Sealed this
Fourteenth Day of August, 2012

David J. Kappos
*Director of the United States Patent and Trademark Office*